United States Patent [19]
Koinuma et al.

[11] Patent Number: 4,719,595
[45] Date of Patent: Jan. 12, 1988

[54] DATA OUTPUT CIRCUIT FOR A DYNAMIC MEMORY

[75] Inventors: Hiroyuki Koinuma; Haruki Toda, both of Yokohama, Japan

[73] Assignee: Kabushiki Kaisha Toshiba, Kawasaki, Japan

[21] Appl. No.: 794,542

[22] Filed: Nov. 4, 1985

[30] Foreign Application Priority Data

Nov. 5, 1984 [JP] Japan .................. 59-232908

[51] Int. Cl.$^4$ .............................. G11C 7/00
[52] U.S. Cl. ............................ 365/189; 365/190
[58] Field of Search ............... 365/189, 190, 203

[56] References Cited

U.S. PATENT DOCUMENTS

| | | | |
|---|---|---|---|
| 4,397,000 | 8/1983 | Nagami | 365/189 |
| 4,602,353 | 7/1986 | Wawersig et al. | 365/189 |
| 4,603,403 | 7/1986 | Toda | 365/189 |

OTHER PUBLICATIONS

Patent Abstracts of Japan, vol. 5, No. 177, Nov. 13, 1981, concerning Japanese Patent Document No. 56-107385.
Japanese Patent (Kokoku) No. 58-10799, N. Kitagawa et al., (2/28/83).

*Primary Examiner*—Joseph A. Popek
*Attorney, Agent, or Firm*—Finngean, Henderson, Farabow, Garrett & Dunner

[57] ABSTRACT

There is disclosed a data output circuit with a nibble mode function for a dynamic memory. The data output circuit comprises a plurality of data output control circuits provided in correspondence with a plurality of paired data transfer nodes. Each pair of transfer nodes is connected to the corresponding memory array and receives data stored in a designated memory cell of the memory cell.

4 Claims 8 Drawing Figures

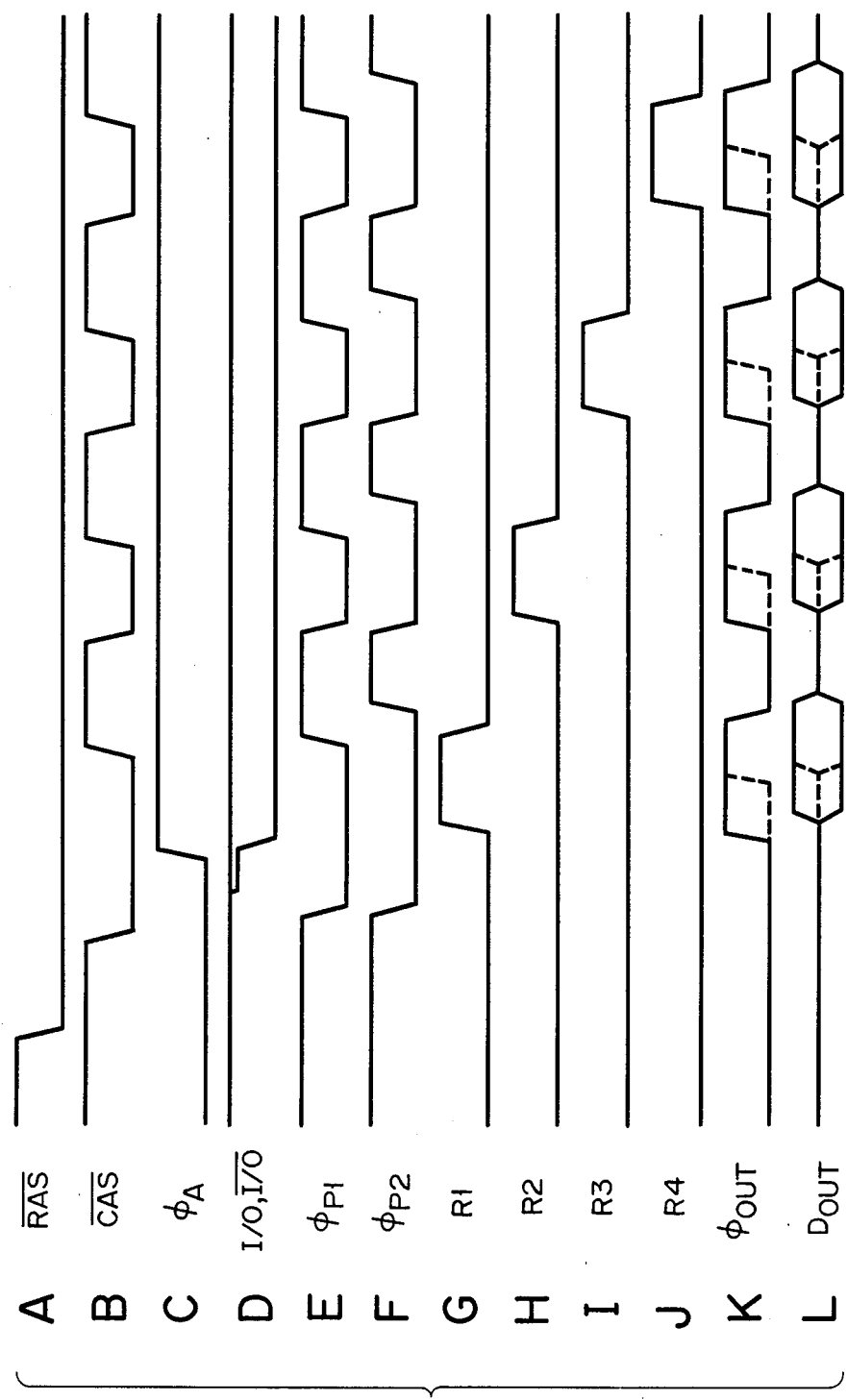

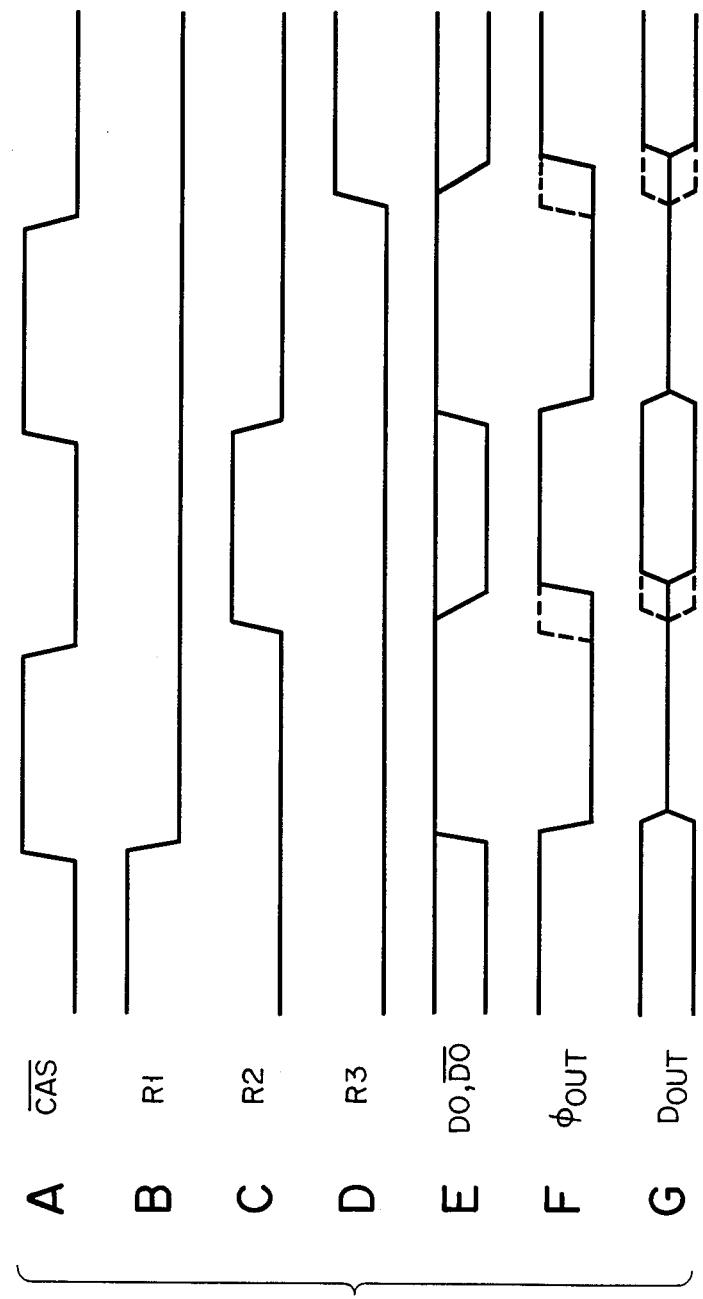

DATA OUTPUT CIRCUIT FOR A DYNAMIC MEMORY

BACKGROUND OF THE INVENTION

The present invention relates to a data output circuit with a nibble mode function for use in a dynamic memory.

A typical example of the conventional data output circuit is schematically illustrated in FIG. 1. As shown in FIG. 1, the data output circuit comprises data latch circuits L1 to L4, a data output control circuit D, and a couple of output transistors 01 and 02. The latch circuits L1 to L4 are respectively coupled with memory arrays C1 to C4, each including a number of matrix arrayed memory cells, through pairs of data transfer nodes I/01 and $\overline{I/01}$ to I/04 and $\overline{I/04}$. The latch circuits L1 to L4 are coupled for reception with switch signals R1 to R4. For selecting one of the latch circuits, the switch signal R associated with the desired latch circuit is selected. The output terminal pairs of these latch circuits L1 to L4 are connected to a pair of intermediate nodes Do and $\overline{Do}$, as shown. The data output control circuit D is connected to the latch circuits L1 to L4 through the paired nodes Do and $\overline{Do}$. For data outputting, the control circuit D allows a data output drive signal $\phi OUT$ to pass and go to either of the output transistors 01 and 02, through nodes N01 and N02.

In the read mode of the dynamic memory, data are concurrently read out from the memory cells in the memory arrays C1 to C4 at the address (x, y), as specified by an address signal. The data read out are transferred, in the form of a potential difference, to the four pairs of data transfer nodes I/01 and $\overline{I/01}$ to I/04 and $\overline{I/04}$, and then latched in the latch circuits L1 to L4. One of switch signals R1 to R4 is specified to drive its associated latch circuit. The latch circuit driven by the specified switch signal provides the data stored therein onto the paired intermediate nodes Do and $\overline{Do}$ in the form of a potential difference. The data is applied to the data output control circuit D which is coupled for reception with the data output drive signal $\phi OUT$. The control circuit D outputs the drive signal $\phi OUT$ onto one of the nodes N01 and N02. The node to which the drive signal $\phi OUT$ is applied is selected according to the contents of the data applied to the control circuit D. The drive signal $\phi OUT$ on the node drives the transistor 01 or 02 connected thereto. Then, the data is output at the output node DOUT. When the transistor 01 is driven, the data of a power source (VDD) level, i.e., a high(H) level, is output. When the transistor 02 is driven, the output data is at a reference or ground potential (VSS) level, i.e. a low (L) level.

In the subsequent active modes, the switch signals R2 to R4 are selected, and the data stored in the latch circuits L2 to L4 are output to the output node DOUT in the above mentioned manner.

FIGS. 2A and 2B illustrate a detailed circuit arrangement of the conventional data output circuit of FIG. 1. All the transistors are of N channel MOS type in the output circuit. As shown in FIGS. 2A and 2B the latch circuit L1 comprises a flip-flop made up of transistors 0102 and 0103, and switching transistors 0101, and 0104 to 0109. The transistor 0101 receives, at its gate, a signal $\phi A$. One end of the current flow path of the transistor 0101 is connected, through a node N0101, to the junction between the current flow path of the transistors 0102 and 0104 and the current flow path of the transistors 0103 and 0105. The other end of the current flow path of the transistor 0101 is connected to VSS. The transistors 0102, 0104, 0106, 0108 are series connected. Similarly, the transistors 0103, 0105, 0107, and 0109 are series connected. The drain of the transistor 0102 is connected to the data transfer node I/01 and the gates of the transistors 0103 and 0105. The drain of the transistor 0103 is connected to the node $\overline{I/01}$ and the gates of the transistor 0102 and 0104. A read/write signal $\phi w$ is coupled with the gates of the transistors 0106 and 0107. The switch signal R1 is connected to the gates of the transistors 0108 and 0109.

The circuit arrangement of the latch circuit L1 is similarly applied to the remaining latch circuits L2 to L4.

The source of the transistor 0108 in the latch circuit L1 is connected to those of the corresponding transistors 0208, 0308 and 0408 in the other latch circuits L2, L3 and L4. Similarly, the source of the transistor 0109 in thel atch circuit L1 is connected to those of 0209, 0309 and 0409 in the other latch circuits L2, L3 and L4. The interconnection of the sources of the transistors 0108, 0208, 0308 and 0408 in the latch circuits L1 to L4 is connected to the intermediate node Do. The interconnection of the source of the transistors 0109, 0209, 0309 and 0409 is connected to the intermediate node $\overline{Do}$.

The intermediate nodes Do and $\overline{Do}$ are coupled with transistors 011 to 013 which are series connected to VDD. The transistor 012 is inserted between the paired nodes Do and $\overline{Do}$. The gates of these transistors 011 to 013 are coupled with a signal $\phi p$.

The data output control circuit D comprises the transistors 014 to 023. The data output drive signal $\phi OUT$ is coupled with the transistors 014 and 015. The signal $\phi p$ is also applied to the gate of the transistors 020 and 021. The transistors 014 and 020 are connected in series between the signal $\phi OUT$ and VSS. Similarly, the transistors 015 and 021 are connected in series between $\phi OUT$ and VSS. The gates of the transistors 016 and 017 are coupled with VDD. The current path of the transistors 016 and 019 is connected between the gate of the transistor 014 and VSS. Similarly, the current paths of the transistors 017 and 018 is connected between the gate of the transistor 015 and VSS. The node Do is connected to the junction between the current paths of the transistors 016 and 019. The other node $\overline{Do}$ is connected to the junction between the current paths of the transistors 017 and 018. The gate of the transistor 018 is connected to the junction between the current paths of the transistors 014 and 020. The gate of the transistor 019 is connected to the junction between the current paths of the transistors 015 and 021. The drain of the transistor 022 is connected to the drain of the transistors 020 and the gate of the transistor 023. The source of the transistor 022 is connected to VSS. The drain of the transistor 023 is connected to the drain of the transistor 021 and the gate of the transistor 022. The source of the transistor 023 is connected to VSS.

The gate of the output transistor 01 is connected, through a node N01, to the gate of the transistor 023. The gate of the output transistor 02 is connected, through a node N02, to the gate of the transistor 022. The transistors 01 and 02 are connected in series between VDD and VSS. The output node DOUT is connected to the junction between the current paths of these transistors 01 and 02.

The operation of the data output circuit will be described referring to FIGS. 3A to 3L.

In the precharge mode, a row address select signal $\overline{RAS}$ and a column address select signal $\overline{CAS}$ are both high (FIGS. 3A and 3B), and the pairs of data transfer nodes I/01 and $\overline{I/01}$ to I/04 and $\overline{I/04}$ are charged up to VDD, viz. the potential at these nodes is high in level (FIG. 3D). The signal $\phi p$ is also high (FIG. 3E). Accordingly, the transistors 011 to 013, coupled with the intermediate nodes Do and $\overline{Do}$, are turned on to charge these nodes to VDD level (FIG. 3J). Further, by the signal $\phi p$ in H level, the transistors 020 and 021 are turned on to place the nodes N01 and N02 at VSS level.

The address signal applied when the signal $\overline{RAS}$ is low is used as the row address signal, while the address signal applied when the signal $\overline{CAS}$ is low is used as the column address signal. The row and column address signals are applied to the memory arrays C1 to C4 for specifying the memory cells from which data are to be read out. When the signal $\overline{CAS}$ goes low, the signal $\phi p$ becomes VSS in potential level. The data are read out from the specified memory cells and transferred onto the node pairs I/O and $\overline{I/O}$ to I/04 and $\overline{I/04}$. Then, the signal $\phi A$ goes high (FIG. 3C). With the H level of the signal $\phi A$, the transistors 0101, 0201, 0301 and 0401 are turned on to place the related nodes N0101, N0201, N0301 and N0401 at VSS level. At this time, one of each pair of transistors 0102 and 0103, 0202 and 0203, 0302 and 0303, and 0402 and 0403 is turned on, so that one of each of node pairs I/01 and $\overline{I/01}$ to I/04 and $\overline{I/04}$ drops to VSS in potential level. In this way, the data are stored and latched in the latch circuits L1 to L4.

One of the switch signals R1 to R4, which are coupled with the paired transistors 0108 and 0109, 0208 and 0209, 0308 and 0309, and 0408 and 0409, is selected by an address designation, and set at high level. It is assumed here that the node I/01 is high in level and the node $\overline{I/01}$ is low. (The write signal $\phi w$ is high in the read mode.) Under this condition, the transistors 0103, 0105, 0107, and 0109 are all turned on. The node $\overline{Do}$ is set at VSS and the node N04 falls to VSS through the transistor 017. At this time, the switch signals R2 to R4 are at VSS. The data read out onto the paired nodes I/02 and $\overline{I/02}$ to I/04 and $\overline{I/04}$ are latched in the latch circuits L2 to L4. Then, the drive signal $\phi OUT$ goes high (FIG. 3K) and, in the control circuit D, the node N01 goes high through the transistor 014. Then, the output transistor 01 is turned on to provide a high level signal at the output node DOUT (FIG. 3L).

If the node I/01 is low and the node $\overline{I/01}$ is high, the transistor 02 is turned on and a low data signal appears at the output DOUT.

The column address signal goes high again and the read operation enters the precharge mode. The switch signal R1 becomes VSS in potential level to electrically disconnect the latch circuit L1 from the paired nodes Do and $\overline{Do}$. The signal $\phi p$ goes high to charge the nodes Do and $\overline{Do}$ up to VDD again. The nodes N01 and N02 drop to VSS in potential. The drive signal $\phi OUT$ also drops to VSS. The signal $\phi A$ remains high in level. The data read out onto the node pairs I/01 and $\overline{I/01}$ are latched in the latch circuits L1 and L4.

The signal $\overline{CAS}$ goes low and the active mode is attained. The switch signal succeeding to the signal R2 goes high. The data on the nodes I/02 and $\overline{I/02}$ is transferred to the intermediate nodes Do and $\overline{Do}$. The control circuit D applies the drive signal $\phi OUT$ to the node N01 or N02, which is selected according to the contents of that data. Finally, the data is ouput to the node DOUT. The switch signals R3 and R4 are subsequently selected and a similar operation is carried out.

As described above, in the prior art circuit of FIGS. 2A and 2B, the output terminal pairs of the latch circuit L1 to L4 are connected to a single pair of intermediate nodes Do and $\overline{Do}$. Of those paired output terminals of the latch circuit L1 to L4, the first output terminals are connected to one of the paired intermediate nodes, and the second output terminals are connected to the other. With this connection, when one active mode is being executed and the column address signal $\overline{CAS}$ goes high, the potential states on the nodes Do and $\overline{Do}$ are cleared. For this reason, the paired nodes Do and $\overline{Do}$ must be charged up to VDD by making the signal $\phi p$ high. Then, the signal $\overline{CAS}$ is set low to set up the succeeding active mode. In this active mode one of the signals R1 to R4 is set high, and after one of the nodes Do and $\overline{Do}$ goes low, the drive signal $\phi OUT$ must be set high. In other words, the setting high operation of the drive signal $\phi OUT$ must wait until one of the nodes Do and $\overline{Do}$ goes low. This is a problem in improving the data read operation.

SUMMARY OF THE INVENTION

Accordingly, an object of the present invention is to provide a data output circuit with a nibble function for use in a dynamic memory in which the data read in the nibble mode is sped up by eliminating the timing restriction to set the level of the data output drive signal $\phi OUT$ high.

According to the present invention, there is a data output circuit for a dynamic memory, comprising a plurality of pairs of data transfer nodes for transferring the data read out from memory cells in the form of a potential difference, a plurality of nodes for receiving switch signals, a plurality of nodes for receiving a data output drive signal, a plurality of pairs of nodes for transferring said data output drive signal, and a plurality of data transfer control circuits provided in correspondence with said data transfer node pairs for transferring said drive signal to one of said drive signal transferring nodes in each of said pairs of said drive signal transferring nodes according to the potential difference applied to said data transfer node pairs and said switch signal; said drive signal transferring node pairs being connected such that first drive signal transferring nodes in said pairs of said drive signal transferring nodes are connected together to a first single data transfer node, and second drive signal transferring nodes in said pairs of said drive signal transferring nodes are connected together to a second signal data transfer node; a first transistor, inserted between a data output node and one of the electrodes of a power source, being connected at the gate to said first single data transfer node, and a second transistor, inserted between the data output node and the other electrode of the power source, being connected at the gate to said second single data transfer node.

BRIEF DESCRIPTION OF THE DRAWINGS

FIGS. 5A to 5L show operational timing charts of the circuit of FIGS. 4A and 4B; and FIGS. 6A to 6G show timing charts comparing the respective operations of the data output circuits of the present invention and the prior art.

DETAILED DESCRIPTION OF THE PREFERRED EMBODIMENT

Figure 1:
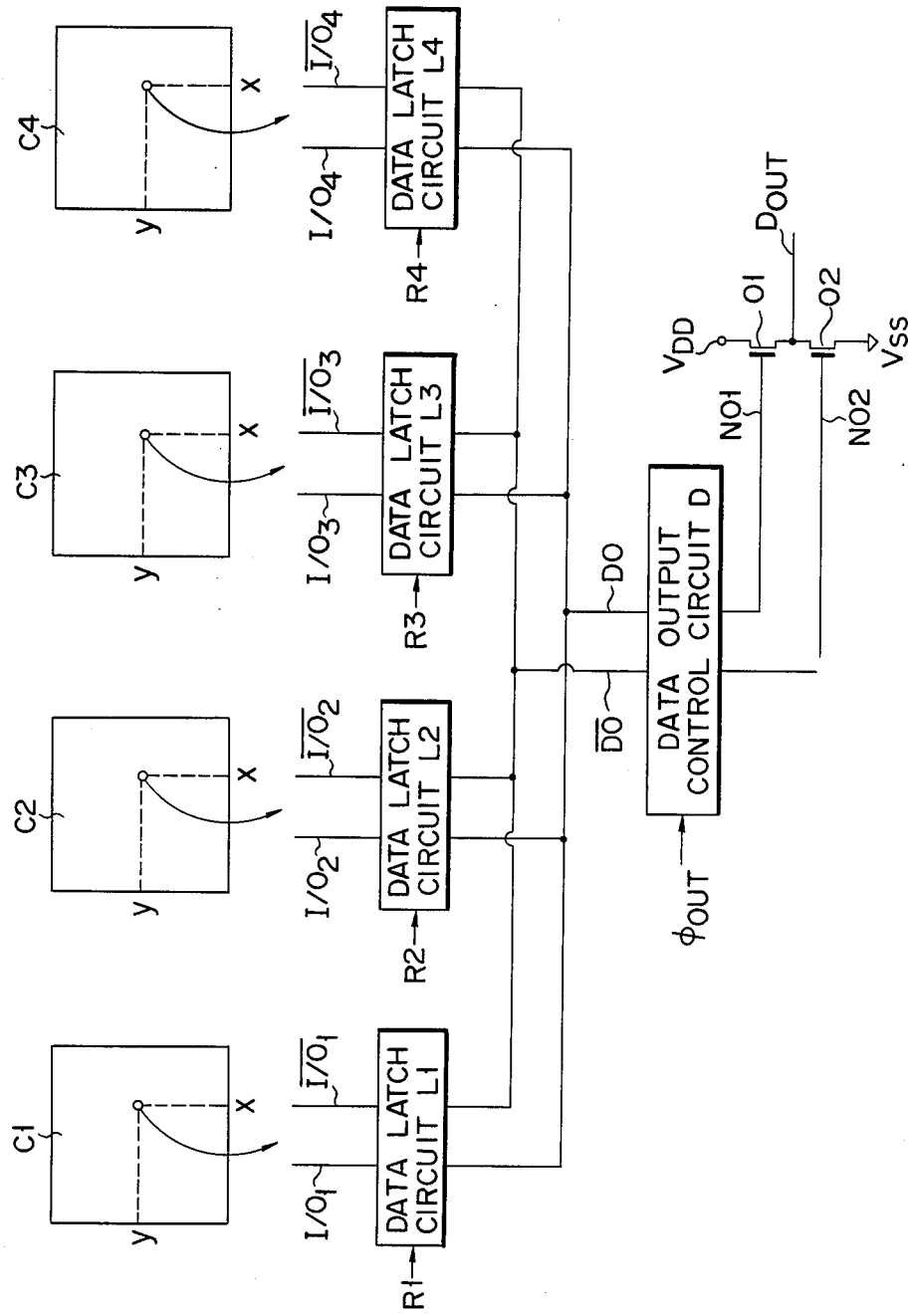
FIG. 1 is a block diagram of a prior art data output circuit with a nibble function.
Figure 2A:
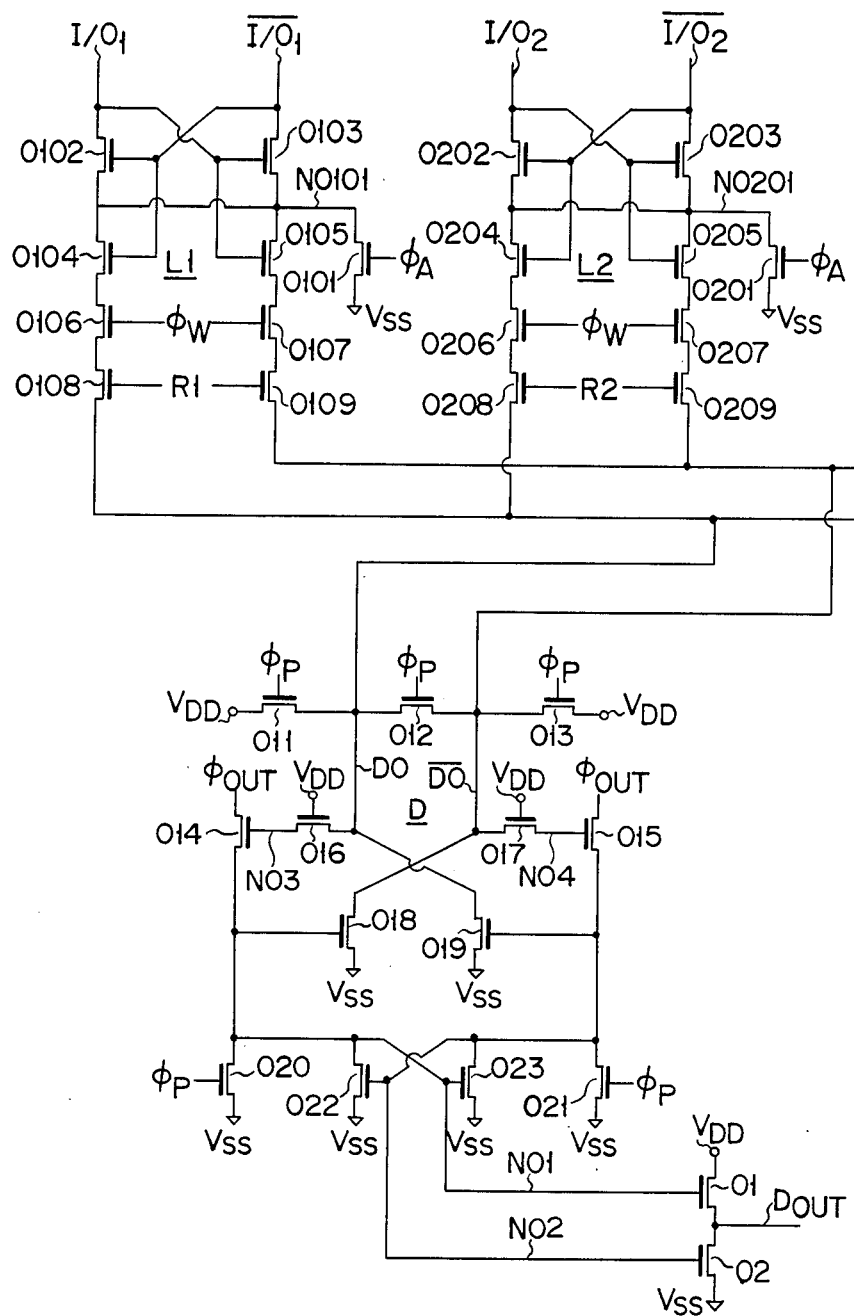
FIGS. 2A and 2B show a circuit diagram of the data output circuit of FIG. 1.
Figure 2B:
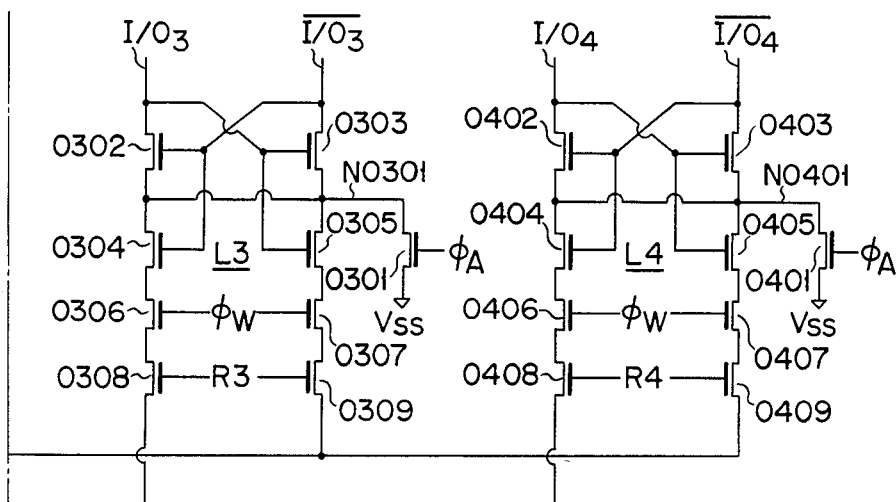
Figure 3:
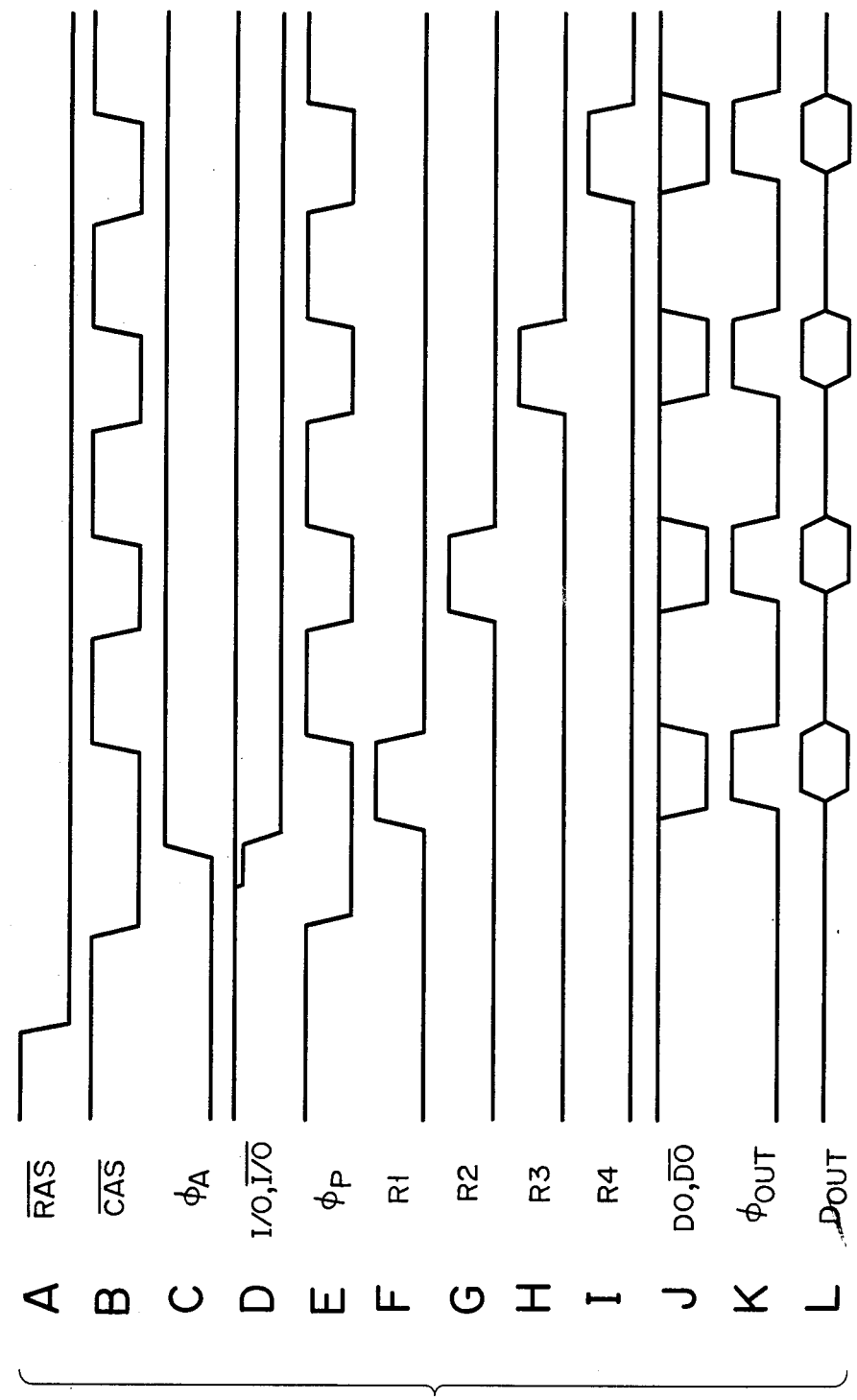
FIGS. 3A to 3L show a set of waveforms of signals at respective portions in the FIG. 1 circuit.
Figure 4A:
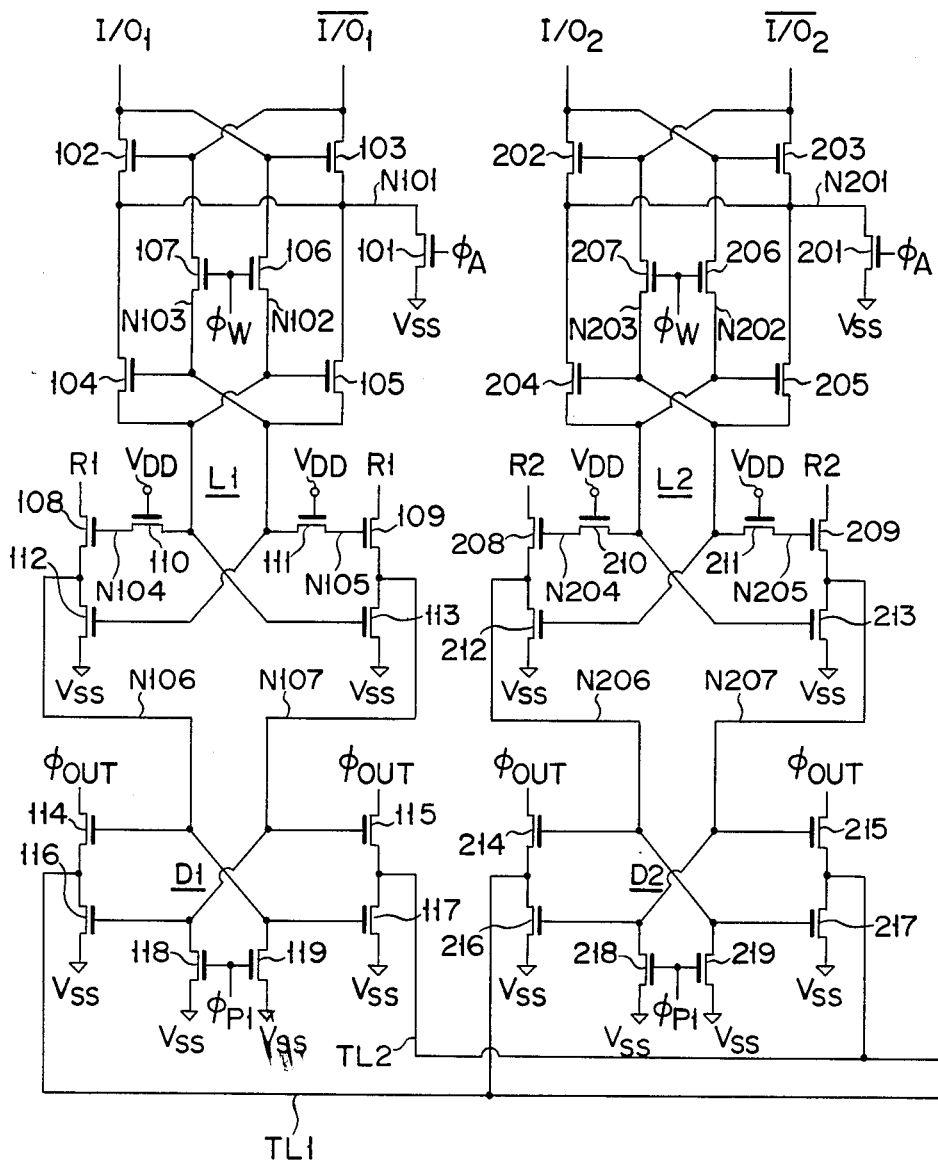
FIGS. 4A and 4B show a circuit diagram of a data output circuit according to an embodiment of the present invention.
Figure 4B:
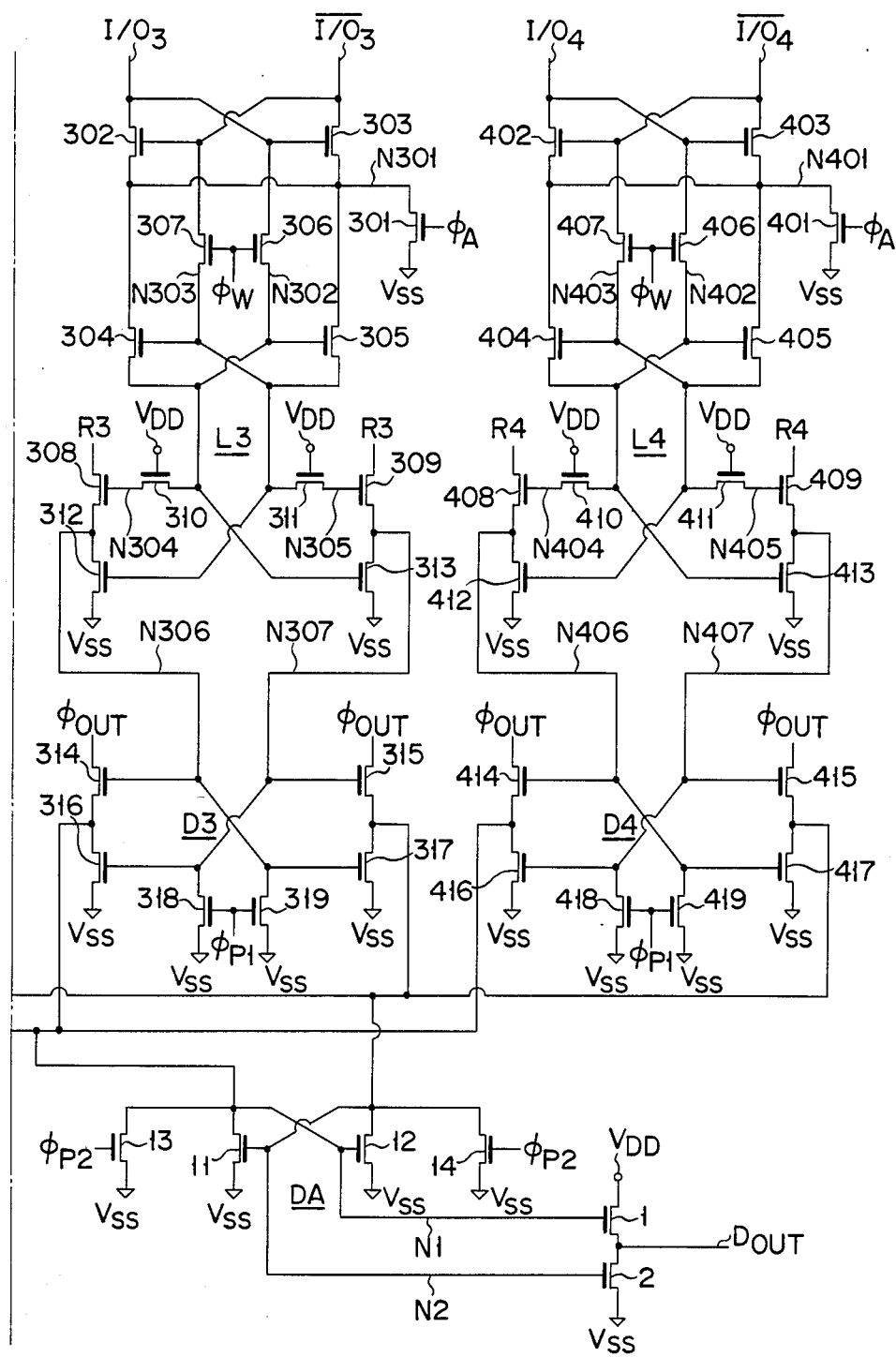

Referring now to FIGS. 4A and 4B, there is shown a preferred embodiment of a data output circuit with a nibble function according to the present invention. As shown, the data output circuit of the present invention comprises latch circuits L1 to L4, data output control circuits D1 to D4 and an auxiliary control circuit DA, and output transistors 1 and 2. All of the transistors used in this circuit are N-channel MOS transistors. The latch circuits L1 to L4 have the same circuit arrangements, and this is true for the control circuits D1 to D4 as well. Accordingly, the latch circuit L1 and the control circuit D1 are both explained.

The latch circuit L1 comprises transistors 101 to 113. The paired transistors 102 and 103 form a flip-flop. The data transfer node I/01 is connected to the drain of the transistor 102 and the gate of the transistor 103. The data transfer node $\overline{I/01}$ is connected to the drain of the transistor 103 and the gate of the transistor 102. The read/write signal $\phi$w is coupled with the gates of paired transistors 107 and 106 as switching elements. The signal $\phi$A is coupled with the gate of the transistor 101. The switch signal R1 is connected to the drains of the transistors 108 and 109. The power source potential VDD is connected to the gates of the transistors 110 and 111. The current paths of the transistors 101, 112 and 113 are each coupled at one end to the reference potential VSS. The junction between the current flow paths of the transistors 108 and 112, and the junction between current flow paths of the transistors 109 and 113 are coupled with intermediate nodes N106 and N107, respectively.

The data output control circuit D1 comprises transistors 114 to 119. The data output drive signal $\phi$OUT is applied to the drain of each of the transistors 114 and 115. The source of each of the transistors 116 to 119 is connected to VSS. The intermediate nodes N106 and N107 are coupled with the gates of the transistors 114 and 115, respectively. The signal $\phi$p1 is coupled with the gates of the transistors 118 and 119. The junction between the current paths of the transistors 114 and 116 is connected by way of the transfer line TL1 to those of the current flow paths of the corresponding transistors in the remaining control circuits D2 to D4. Similarly, the junction between the current paths of the transistors 115 and 117 is connected by way of the transfer line TL2 to those of the current flow paths of the corresponding transistors in the control circuits D2 to D4.

The output drive circuit DA comprises transistors 11 to 14. The transfer lines TL1 and TL2 are coupled with one end of the current path of each of the transistors 11 and 13 and one end of the current path of each of the transistors 12 and 14, respectively. The other ends of the current paths of these transistors 11 to 14 are coupled with VSS. The gates of the transistors 13 and 14 are coupled with to a signal $\phi$p2.

Nodes N1 and N2 are located between the gates of the transistors 12 and 1 and between the gates of the transistors 11 and 2, respectively. The output node DOUT is connected to the junction between the current paths of the transistors 1 and 2. Other detailed interconnections among the circuit elements are referred to in the drawings of FIGS. 4A and 4B.

The operation of the data output circuit thus arranged will be described with reference to FIGS. 5A to 5L. In the precharge mode the row address select signal $\overline{RAS}$ and the column address select signal $\overline{CAS}$ are both high in level (FIGS. 5A and 5B). The pairs of the data transfer nodes I/01 and $\overline{I/01}$ to I/04 and $\overline{I/04}$ are charged up to VDD. Further, the read/write signal $\phi$w is high in the read mode. Under this condition, the transistors 106, 107, 110 and 111 in the latch circuit L1, and the corresponding transistors 206, 207, 210, 211, 306, 307, 310, 311, 406, 407, 410 and 411 in the remaining latch circuits L2 to L4 are in the ON state. Therefore, the nodes N102 to N105 in the latch circuit L1, and the corresponding nodes N202 to N205, N302 to N305 and N402 to N405 in the remaining latch circuits L2 to L4 are set at high level. The nodes N102 to N105, N202 to N205, N302 to N305 and N402 to N405 are associated with the transistors 106, 107, 110, 111, 206, 207, 210, 211, 306, 307, 310, 311, 406, 407, 410 and 411. In this mode, the signals $\phi$p1 and $\phi$p2 are high (FIGS. 5E and 5F). The paired transistors 118 and 119 in the data output control circuit D1, and the corresponding transistors 218, 219, 318, 319, 418 and 419 in the other data output control circuits D2 to D4, and the transistors 13 and 14 in the auxiliary control circuit DA are all in the ON state. The nodes N106 and N107, N206 and N207, N306 and N307, and N406 and N407, and the nodes N1 and N2 are all at VSS level.

When the signal $\overline{RAS}$ goes low, and is then followed by the signal $\overline{CAS}$, the data are read out from the specified memory cells in the memory arrays and transferred to the paired nodes I/01 and $\overline{I/01}$ to I/04 and $\overline{I/04}$. The signal $\phi$A goes high to turn on the transistors 101, 201, 301 and 401. The nodes N101, N201, N301 and N401 are placed at VSS level. The transistor pairs 102 and 103, connected to the node N101; the transistor pairs 202 and 203, connected to the node N201; the transistor pairs 302 and 303, connected to the node N301; and the transistor pairs 402 and 403, connected to the node N401, are turned on. Accordingly, the data on the nodes I/01 and $\overline{I/01}$ to I/04 and $\overline{I/04}$ are latched in the flip-flops of the latch circuits L1 to L4. At this time the paired transistors 104 and 105, 204 and 205, 304 and 305, and 404 and 405 are turned on. As a result, one of each pair of nodes N104 and N105, N204 and N205, N304 and N305, and N404 and N405 is set at VSS level through the paired nodes N102 and N103, N202 and N203, N302 and N303, and N402 and N403, and the current paths of the paired transistors 110 and 111, 210 and 211, 310 and 311, and 410 and 411. (The data are also stored at those nodes.)

Assume now that, of the switch signals R1 to R4, the signal R1 is selected by an address designation and goes high, and that the node I/01 is high and the node $\overline{I/01}$ is low. This being the case, the node N106 is high and the transistor 114 is turned on. The data output drive signal $\phi$OUT (FIG. 5K) is allowed to go to the node N1. The high level drive signal $\phi$OUT drives the output transistor 1 so that a high level signal appears as the output data at the output node DOUT (FIG. 5L). (It should be noted here that the drive signal $\phi$OUT can be set high at any time during the read cycle.) When the switch signal R1 is selected as now assumed, the switch signals R2 to R4 are at VSS level. Accordingly, the paired nodes N206 and N207, N306 and N307, and N406 and N407 are at VSS regardless of the read out data. The read/write signal φw is low in the write mode to disconnect the data output circuit from the paired nodes I/01 and $\overline{I/01}$ to I/04 and $\overline{I/04}$.

The column address signal $\overline{CAS}$ goes high and the signal φp1 also goes high. By the H level signal φp1, the nodes N106 and N107 are placed at VSS level to disconnect the signal φOUT from the node N1. With this disconnection, if the drive signal φOUT drops to VSS, the data as read out in the previous read cycle are left at the nodes N1 and N2. In this case, the node N1 keeps the H level. Accordingly, the data of H level at the output node DOUT remains effective, whereas the output data is rendered ineffective by setting the signal φp2 to the H level.

The signal $\overline{CAS}$ goes low again and the read operation enters a nibble mode. In this mode the switch signal R2 is selected and set at high level. The contents of the data read out to the nodes I/02 and $\overline{I/02}$ cause one of the nodes N206 and N207 to go high. In the read mode the data output drive signal φOUT is high, as described above. The high drive signal φOUT reaches one of the output transistors 1 and 2 and drives it so that the data is set at the output node DOUT, as in the previous cycle.

To start the data write at the initial stage of the active cycle, the drive signal φOUT is kept at VSS level, so that no data appears at the output node DOUT.

As seem from the foregoing description, the timing to set the drive signal φOUT at H level for the output of the data onto the output node DOUT may be set at any time position during the read cycle. For example, if the drive signal φOUT is rendered high before the switch signal R goes high, the data is output in response to the H level of the switch signal R. In contrast, if the drive signal φOUT is set high after the switch signal R goes high, the data is output in response to the high level of the drive signal φOUT.

Turning now to FIGS. 6A to 6G, waveforms of the signals of the respective data output circuits of the present invention and the prior art, are shown both for the purpose of comparison and in the interest of explaining the read operation. In FIGS. 6F and 6G dotted lines indicate the waveforms of the signal in the data output circuit of the present invention. As clearly seen from FIGS. 6A to 6G, in the prior art outputting the data onto the node DOUT necessitated that one of the intermediate nodes Do and $\overline{Do}$ go low before the drive signal φOUT could be set high. In the data output circuit of the present invention, the drive signal φOUT can be set high at any time in the read cycle. Accordingly, the data output circuit for the dynamic memory according to the present invention can produce read out data at a high speed.

What is claimed is:

1. A circuit for reading out data from a plurality of memory cells in a dynamic memory, comprising:
   a plurality of pairs of data transfer nodes coupled to selected memory cells, for receiving data transferred from the selected memory cells, with one node in each pair being set at a high level and the other node being set at a low level at times when data is read out from the selected memory cells;
   a plurality of latch circuits, each being coupled to a corresponding pair of the data transfer nodes, to a corresponding one of a plurality of switch signals for selecting one of the latch circuits, and to a corresponding one of a plurality of pairs of intermediate nodes, for setting one intermediate node at a high level and the other intermediate node at a low level in one pair of intermediate nodes at times when the corresponding latch circuit is selected, and for setting both nodes in each pair of intermediate nodes at one of the high level and the low level at times when the corresponding latch circuit for said pair is not selected;
   a plurality of data output control circuits, each being coupled to a corresponding one of the pairs of intermediate nodes, to a data output drive signal, and to a pair of transfer lines, and being responsive to the levels of the corresponding intermediate nodes to couple the data output drive signal to one transfer line at times when the corresponding latch circuit is selected, and to decouple the data output drive signal from the transfer lines at times when the corresponding latch circuit is not selected;
   an output drive circuit coupled to the pair of transfer lines for driving one of a pair of output transistors at times when the output drive signal is coupled to one of the pair of transfer lines;
   a power source having first and second electrodes;
   a first output transistor of said pair of output transistors being coupled to a data output node and said first electrode of said power source; and
   a second output transistor of said pair of output transistors being coupled to the data output node and said second electrode of said power source, said first and second output transistors being driven by the output drive circuit to set the data output node at a high and a low level in accordance with the data read out form the selected memory cells;
   wherein the setting of both intermediate nodes in each of the intermediate node pairs at the one level at times when the corresponding latch circuits are not selected enables the data output drive signal to be set before the switch signals select one of the of latch circuits.

2. The data readout circuit according to claim 1, in which, in an operation mode for disconnecting said data output node from one of said electrodes of said power source, said transfer lines are electrically disconnected from said data output drive signal before the level of said data output drive signal is set to that of the other electrode of said power source.

3. The data readout circuit according to claim 1, in which, in a data write mode, the pairs of said data transfer nodes are electrically disconnected from said latch circuits.

4. The data readout circuit according to claim 1, in which, in a mode in which data write is only performed, said data output drive signal is kept at such a level as to render said first and second transistors nonconductive.

* * * * *